United States Patent
Choi

(10) Patent No.: US 8,006,373 B2
(45) Date of Patent: Aug. 30, 2011

(54) TAPE FEEDER FOR CHIP MOUNTER

(75) Inventor: Hyung-soo Choi, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 685 days.

(21) Appl. No.: 12/080,730

(22) Filed: Apr. 4, 2008

(65) Prior Publication Data

US 2008/0263856 A1 Oct. 30, 2008

(30) Foreign Application Priority Data

Apr. 27, 2007 (KR) .......................... 10-2007-0041619

(51) Int. Cl.
*B23P 19/00* (2006.01)

(52) U.S. Cl. ................ 29/762; 29/739; 29/740; 29/759; 29/806; 226/76; 226/115; 226/148

(58) Field of Classification Search .................... 29/762, 29/739, 740, 759, 806; 16/85, 235, 250, 16/286, 289, 335; 226/57, 76, 115, 122, 226/128, 148, 157

See application file for complete search history.

(56) References Cited

U.S. PATENT DOCUMENTS

| 2,198,346 A | * | 4/1940 | Little ............................ 126/191 |
| 6,652,706 B1 | * | 11/2003 | MacNeil et al. .............. 156/344 |

FOREIGN PATENT DOCUMENTS

| KR | 10-2001-0048199 A | 6/2001 |
| KR | 10-2006-0102885 A | 9/2006 |

* cited by examiner

*Primary Examiner* — Thiem Phan
(74) *Attorney, Agent, or Firm* — Drinker Biddle & Reath LLP

(57) ABSTRACT

A tape feeder for a chip mounter is provided. The tape feeder includes a frame, a first link, a second link, and a middle link. A tape is fed along the frame. The first link includes a guide unit guiding the tape and a first end rotatably connected to the frame. The first link is capable of being rotated between a closed position in which the guide unit couples with the frame to guide the tape and an open position in which the guide unit is placed away from the frame. The second link is rotatably connected to the frame and includes a first end supported relative to the frame. The middle link includes a first end rotatably connected to a second end of the first link and a second end rotatably connected to a second end of the second link.

5 Claims, 8 Drawing Sheets

TAPE FEEDER FOR CHIP MOUNTER

CROSS-REFERENCE TO RELATED PATENT APPLICATION

This application claims the benefit of Korean Patent Application No. 10-2007-0041619, filed on Apr. 27, 2007, in the Korean Intellectual Property Office, the disclosure of which is incorporated herein in its entirety by reference.

BACKGROUND OF THE INVENTION

1. Field of the Invention

The present invention relates to a tape feeder for a chip mounter, and more particularly, to a tape feeder including a stable guide shutter that can be easily handled for replacing a component reel.

2. Description of the Related Art

Chip mounters are used for mounting electronic components on a printed circuit board (PCB). For example, a component feeder supplies various electronic components such as an integrated circuit (IC) component, a diode, a condenser, and a resistor to a chip mounter, and then, the chip mounter moves the components to predetermined positions on a PCB and mounts the components on the PCB.

Such a chip mounter includes a component feeder, a conveyer, a head assembly, and a component transport unit. The component feeder supplies components to the chip mounter, and the conveyer moves a PCB. The head assembly includes suction nozzles to move the components from the component feeder to the PCB. The component transport unit moves the head assembly vertically or horizontally.

A tape feeder having a component reel is usually used as the component feeder of the chip mounter. FIG. 1 is a perspective view illustrating a conventional component reel for a tape feeder.

Referring to FIG. 1, it can be appreciated that thousands of components may be accommodated in the component reel. A tape 2 is wound around the component reel, and accommodation spaces 2a are formed in the tape 2 at predetermined intervals. Electronic components 5 such as semiconductor chips are accommodated in the accommodation spaces 2a, and a top cover tape 2b is attached to a top surface of the tape 2 to cover the electronic components 5. A plurality of perforation holes 2c are formed at both sides of the tape 2 at predetermined intervals.

In a chip mounter, tape feeders which feed the component reel shown in FIG. 1 are evenly disposed in parallel to each other. The tape feeder feeds the tape 2 to the chip mounter. When the tape 2 is fed to the chip mounter, the top cover tape 2b is removed from the tape 2 to reveal the electronic components 5. After the top cover tape 2b is removed from the tape 2, the head assembly picks up the electronic components 5 from the tape 2 using its suction nozzles. Then, the head assembly moves the electronic components 5 to predetermined positions on a PCB.

FIG. 2 is a side view illustrating a tape feeder for a chip mounter. The tape feeder is disclosed in Korean Patent Laid-Open Publication NO. 2006-0102885 that was filed by the Assignee of the present application.

Referring to FIG. 2, the tape feeder includes a component reel 10 and a frame 11 on which the component reel 10 is mounted. A tape is wound around the component reel 10 and is unwound from the component reel 10 on a pitch basis by a sprocket 13. When the tape is unwound from the component reel 10, a top cover tape (e.g., top cover tape 2b, FIG. 1) is removed from the tape and is discharged to a collector 14.

After all electronic components are fed from the component reel 10, the component reel 10 has to be replaced with a new one. When a new component reel 10 is mounted on the frame 11, a lock mechanism 15 formed on a front portion of the tape feeder is released to unlock a tape guide 16, and the tape guide 16 is lifted. As shown, the tape guide 16 is configured at a forward, top portion of the frame proximate to the sprocket 13. The tape guide 16 is pivotally coupled to the frame 11 at a rearward end of the tape guide 16 such that a forward end of the tape guide 16 is upwardly and downwardly movable. With the tape guide 16 in the open (i.e., upward) position, leading ends of a tape and a top cover tape of the new component reel 10 are connected to predetermined parts of the tape feeder. Thereafter, the tape guide 16 is moved downward and is locked in the closed position using the lock mechanism 15.

However, in this case, an operator may have to use his/her both hands to unlock the lock mechanism 15 and lift the tape guide 16. That is, it is inconvenient for the operator to replace the component reel 10 with a new one since the operator must use his/her both hands. Furthermore, since the tape guide 16 is not fixed (i.e., held or maintained) in the open position when the tape guide 16 is lifted up, the operator may have to continuously hold the tape guide 16 upward with one hand and draw the tape from the component reel 10 with the other hand, thereby making it more inconvenient to replace the component reel 10 with a new one.

In addition, after the component reel 10 is replaced with a new one, the operator must check whether the lock mechanism 15 properly locks the tape guide 16 because it may be possible for the operator to couple the tape feeder to a chip mounter without having the lock mechanism 15 properly locking the tape guide 16 in the closed position. When the tape guide 16 is not securely or positively locked in the closed position, when a tape and a top cover tape are unwound from the new component reel 10, the tape guide 16 can be undesirably lifted by the unwound top cover tape, and thus electronic components cannot be supplied to the chip mounter.

Moreover, when the tape guide 16 and the lock mechanism 15 are not stably coupled to each other, the tape guide 16 can be lifted and collide with a head assembly 20 that moves for picking up electronic components.

SUMMARY OF THE INVENTION

The present invention provides a tape feeder for a chip mounter, the tape feeder including guide shutter that can be handled easily and stably.

The present invention also provides a tape feeder for a chip mounter, the tape feeder having a structure for easily replacing a component reel.

The present invention also provides a reliable tape feeder for a chip mounter, the tape feeder including a guide shutter that can be stably placed in a closed position when components are supplied from the tape feeder to the chip mounter.

The present invention also provides a tape feeder for a chip mounter, the tape feeder including a guide shutter, the guide shutter having a one-touch type three-linkage structure for being stably kept in closed and open positions.

According to an aspect of the present invention, there is provided a tape feeder for a chip mounter, the tape feeder including: a frame along which a tape is fed; a first link including a guide unit guiding the tape and a first end rotatably connected to the frame so as to be rotated between a closed position in which the guide unit couples with the frame to guide the tape and an open position in which the guide unit is placed away from the frame; a second link rotatably connected to the frame and including a first end supported relative to the frame; and a middle link including a first end rotatably connected to a second end of the first link and a second end rotatably connected to a second end of the second link.

The middle link may further include a support extending from the second end of the middle link toward the second link, and the second link may further include a stopper supporting the support of the middle link when the first link is placed in the open position.

The second link may be supported relative to the frame by a spring.

The guide unit may include an opening through which a portion of the tape is exposed.

The guide unit may include a cutout through which a top cover tape is guided so as to be removed from one side of the tape.

According to another aspect of the present invention, there is provided a tape feeder for a chip mounter, the tape feeder including: a frame coupled with a component reel around which a tape is wound, the tape including components accommodated in a front side and a top cover tape attached to the front side; a sprocket rotatably coupled to the frame so as to feed the tape from the component reel; a first link including a first end rotatably coupled to the frame and a guide unit guiding the tape fed by the sprocket by pushing the tape against the frame, the guide unit including a cutout through which the top cover tape is guided so as to be removed from the front side of the tape and an opening through which some of the components accommodated in the tape is exposed after the top cover tape is removed from the tape; a second link rotatably connected to the frame and including a first end supported relative to the frame; and a middle link rotatably coupled to a second end of the first link and a second end of the second link so as to connect the first and second links, wherein the first link is capable of being rotated between a closed position in which the guide unit pushes the tape against the frame and an open position in which the guide unit is placed away from the frame.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A tape feeder for a chip mounter will now be described more fully with reference to the accompanying drawings, in which exemplary embodiments of the invention are shown.

Figure 3:
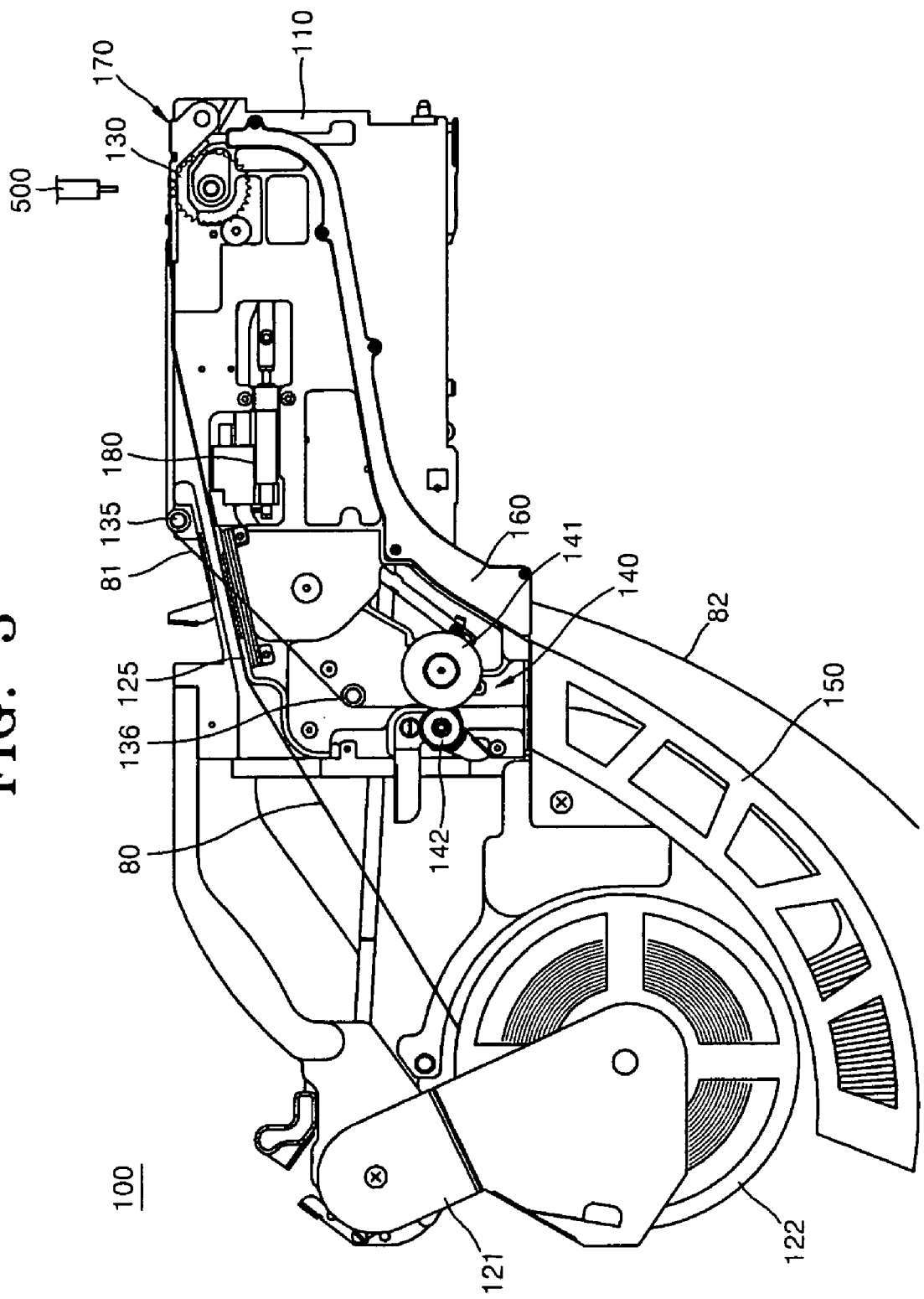
FIG. 3 is a side view illustrating a tape feeder for a chip mounter according to an embodiment of the present invention.
Figure 4:
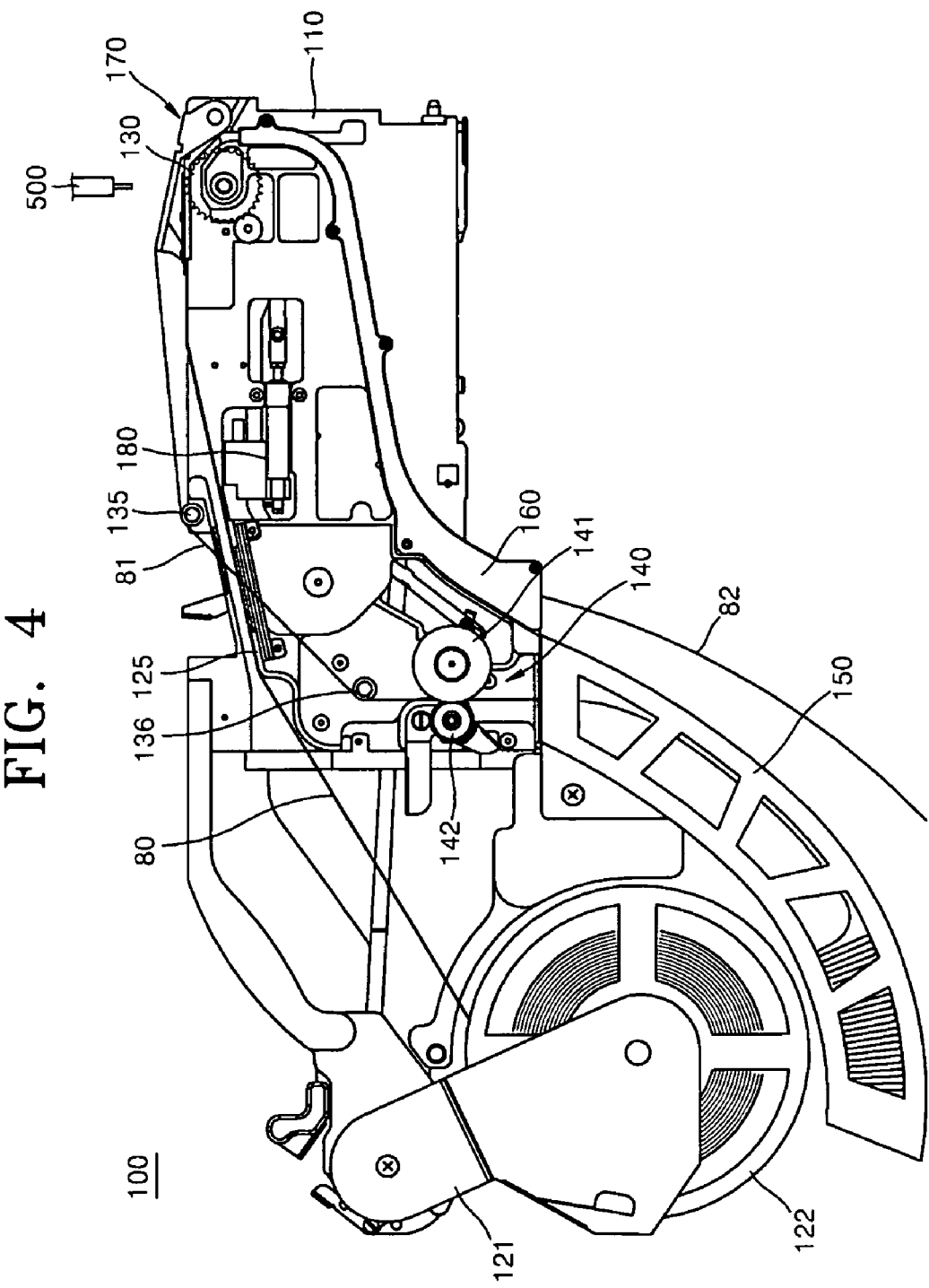
FIG. 4 is a side view illustrating the tape feeder of FIG. 3 when the tape feeder is in an open position according to an embodiment of the present invention.

FIG. 3 is a side view illustrating a tape feeder 100 for a chip mounter according to an embodiment of the present invention, and FIG. 4 is a side view illustrating the tape feeder 100 of FIG. 3 when the tape feeder 100 is in an open position according to an embodiment of the present invention.

Referring to FIGS. 3 and 4, the tape feeder 100 includes a frame 110 and a guide shutter 170 mounted on a front portion of the frame 110. When a tape 80 is unwound from a component reel 122, the guide shutter 170 guides the tape 80 and allows a top cover tape 81 to be removed from the tape 80.

The frame 110 supports elements of the tape feeder 100. A component reel support 121 is formed at a rear portion of the frame 110 to receive the component reel 122. A sprocket 130 is rotatably coupled to the front portion of the frame 110 proximate to the guide shutter 170 for feeding the tape 80 from the component reel 122 on a pitch basis. A cover tape collector 140 is installed to the frame 110 to collect the top cover tape 81 removed from the tape 80. A collector container 150 is installed close to the cover tape collector 140 to store the top cover tape 81 collected by the cover tape collector 140.

The sprocket 130 and the cover tape collector 140 can be driven by a single power source 180. In this case, power can be transmitted from the power source 180 to the sprocket 130 and the cover tape collector 140 using separate power transmission members (not shown). Various power transmission members known in the art may be employed such as, for example, a mechanical link or links, a worm gear, a gear train, etc. The power source 180 may be a motor such as a servomotor.

The component reel 122 is coupled to the component reel support 121. The tape 80 is wound around the component reel 122 in the form of a roll. A plurality of electronic components is stored by the tape 80. The tape 80 includes an accommodation tape 82 and the top cover tape 81. A plurality of electronic components is accommodated in the accommodation tape 82, and the top cover tape 81 is bonded to one side of the accommodation tape 82.

Figure 5:
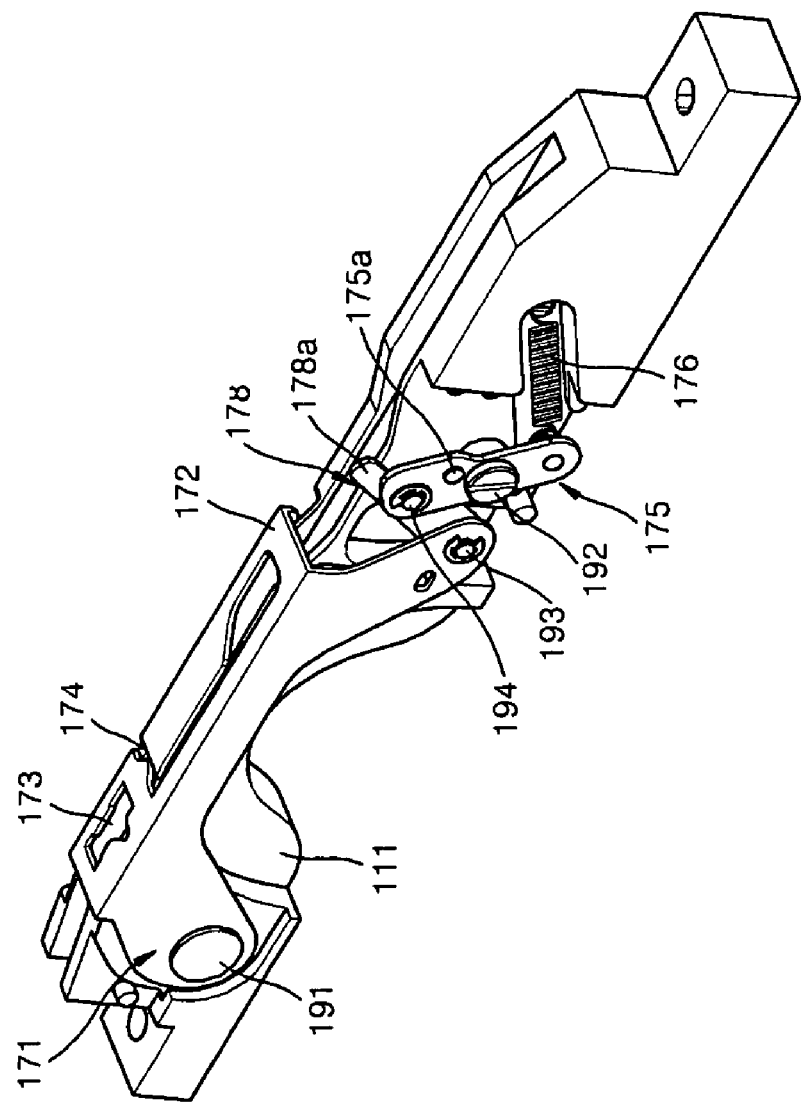
FIG. 5 is a perspective view illustrating a portion of the tape feeder of FIG. 3 when the tape feeder is in a closed position, according to an embodiment of the present invention.
Figure 6:
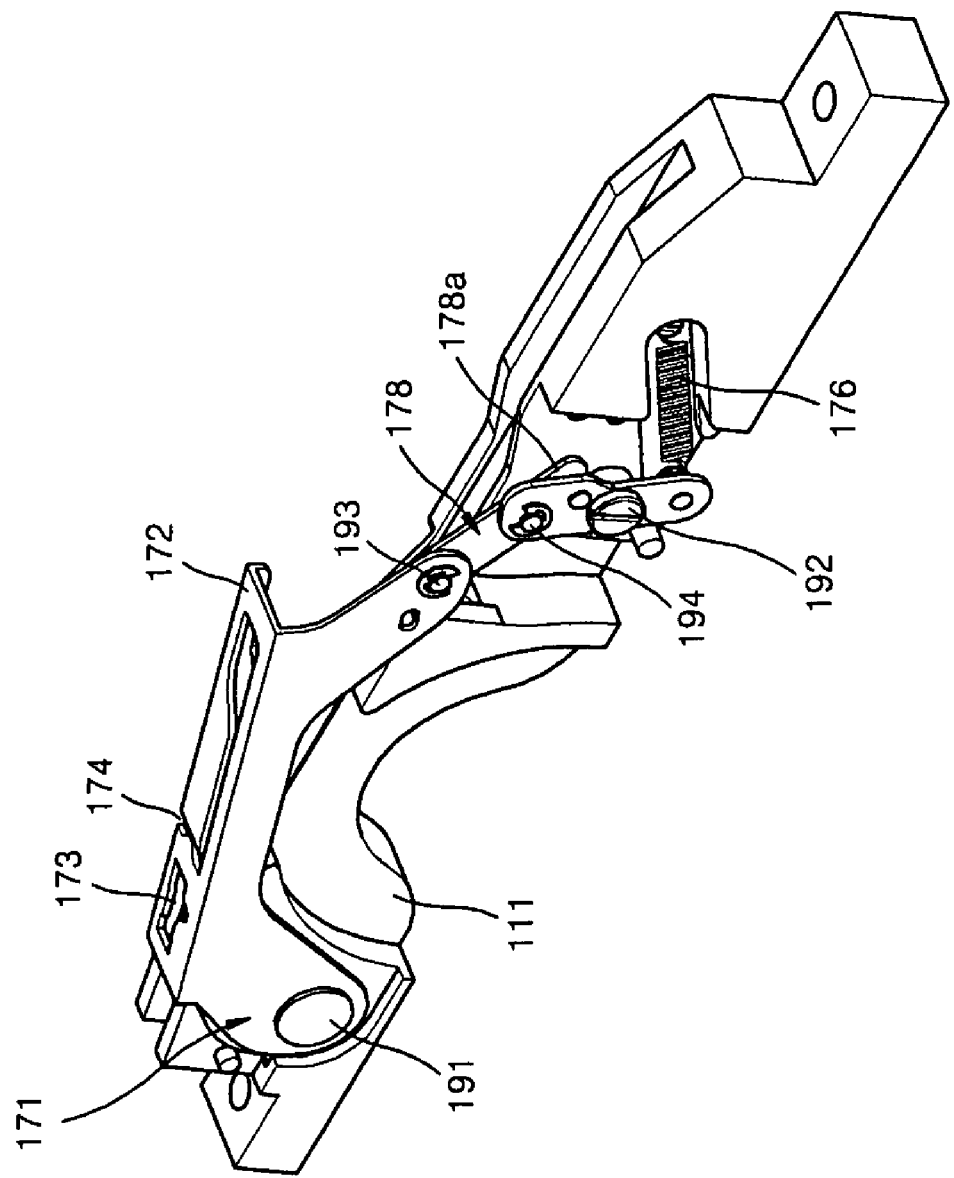
FIG. 6 is a perspective view illustrating the portion of the tape feeder of FIG. 3 when the tape feeder is in an open position, according to an embodiment of the present invention.

FIG. 5 is a perspective view illustrating a portion of the tape feeder 100 proximate to and including the guide shutter 170 with the tape feeder 100 in a closed position according to an embodiment of the present invention, and FIG. 6 is a perspective view illustrating the same portion of the tape feeder 100 when the tape feeder 100 is in an open position according to an embodiment of the present invention.

The guide shutter 170 mounted on the front, top portion of the frame 110 has a three-linkage structure. In detail, the guide shutter 170 includes a first link 171, a second link 175, and a middle link 178. The first and second links 171 and 175 are rotatably coupled to the frame 110, and the middle link 178 is connected between the first and second links 171 and 175.

As shown in FIGS. 3 and 4, a front end of the first link 171 (i.e., an end of the first link 171 that is most distal from the component reel 122) is rotatably or pivotally coupled to the frame 110. As shown in FIGS. 5 and 6, the front end of the first link 171 is coupled to the frame 110 using a first hinge pin 191. A guide unit 172 is formed as integral part of the first link 171 to guide the tape 80. The guide unit 172 extends in a tape-feed direction. The guide unit 172 is shaped to engage with a pick-up station 111 of the frame 110 where the sprocket 130 is mounted.

The tape 80 is fed along the pick-up station 111 by the sprocket 130. The guide unit 172 cooperates with the pick-up station 111 to push the tape 80 against the sprocket 130 so that the tape 80 can be stably fed.

A center portion of the second link 175 is rotatably coupled to the frame 110 using a second hinge pin 192. A first end (i.e., forward end) of the second link 175 is connected to the frame 110 by an elastic member, and thus the second link 175 can be rotated on the second hinge pin 192 within a predetermined angle. That is, the elastic member has a bias that urges the first end of the second link 175 to a forward orientation. In the current embodiment, an end of the second link 175 is connected to the frame 110 by a spring 176 such that the second link 175 can be elastically supported with respect to the frame 110. However, the present invention is not limited to the spring 176. For example, a cylinder with gas or oil can be used as the elastic member instead of the spring 176.

An end of the middle link 178 is rotatably coupled to the end of the first link 171 using a third hinge pin 193, and the other end of the middle link 178 (i.e., the end of middle link 178 from which support 178a extends) is rotatably coupled to the other end of the second link 175 using a fourth hinge pin 194. The middle link 178 connects the first and second links 171 and 175. The middle link 178 interacts with the second link 175 such that the first link 171 can be positively maintained in one of the closed position shown in FIG. 5 and the open position shown in FIG. 6.

The first link 171 can be rotated about the first hinge pin 191 between the closed position shown in FIG. 5 and the open position shown in FIG. 6. When the first link 171 is placed in the closed position, the guide unit 172 of the first link 171 pushes the tape 80 against the pick-up station 111 of the frame 110 such that the tape 80 can be stably fed by the sprocket 130.

When it is needed to replace the component reel 122 with a new one after all electronic components are supplied from the component reel 122, an operator can manipulate the guide shutter 170 to place the first link 171 in the open position as shown in FIG. 6. In this open position, the first link 171 is positively maintained in an upward orientation such that the operator can insert a tape 80 of a new component reel 122 into the pick-up station 111 and detach a leading end of a top cover tape 81 from the tape 80 to pass the leading end of the top cover tape 81 through a cutout 174 of the guide unit 172. Then, the operator can connect the leading end of the top cover tape 81 to collector guides 135 and 136 and collector gears 141 and 142 as shown in FIGS. 3 and 4.

The tape 80 can be fed to a pick-up position by the sprocket 130 formed at the front portion of the frame 110. When the tape 80 is fed to the pick-up position, a head assembly 500 approaches the tape 80. Teeth of the sprocket 130 engage with perforation holes formed in the tape 80 so that the sprocket 130 feeds the tape 80 by predetermined pitches. When the sprocket 130 rotates, the tape 80 is unwound from the component reel 122 and is guided by a transport guide 125 to the pick-up position of the frame 110 where the guide shutter 170 is disposed.

The top cover tape 81 attached to a top surface of the tape 80 is removed from the 80 before the tape 80 reaches the pick-up position. Therefore, electronic components accommodated in an accommodation tape 82 of the tape 80 can be sequentially picked up by the head assembly 500. In detail, when the top cover tape 81 is removed from the tape 80, electronic components of the tape 80 are exposed such that the head assembly 500 can pick up the electronic components from the tape 80 through an opening 173 formed in the guide unit 172.

The top cover tape 81, which is removed from the tape 80, is bent at the direction-reversing cutout 174 of the guide shutter 170 and is guided to the cover tape collector 140 by the collector guides 135 and 136.

The cover tape collector 140 can include a pair of gears such as the collector gears 141 and 142 that are engaged with each other. The top cover tape 81 is discharged to the collector container 150 after the top cover tape 81 passes between the collector gears 141 and 142. The collector container 150 stores the top cover tape 81 removed from the tape 80.

After electronic components are picked up from the accommodation tape 82 of the tape 80, the accommodation tape 82 is discharged from the tape feeder 100 along a discharge guide 160. When the accommodation tape 82 is discharged along the discharge guide 160, the collector container 150 functions as a guide structure for the accommodation tape 82. Therefore, the accommodation tape 82 can be discharged to a rear side of the tape feeder 100 without interfering with other components such as the component reel 122.

Figure 7:
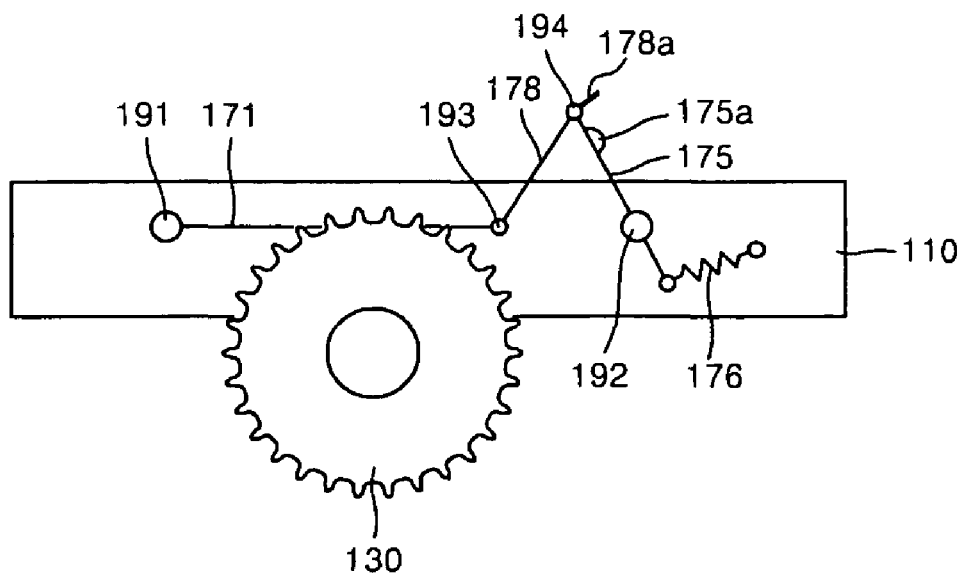
FIG. 7 is a schematic view illustrating the tape feeder of FIG. 3 when the tape feeder is in a closed position according to an embodiment of the present invention.
Figure 8:
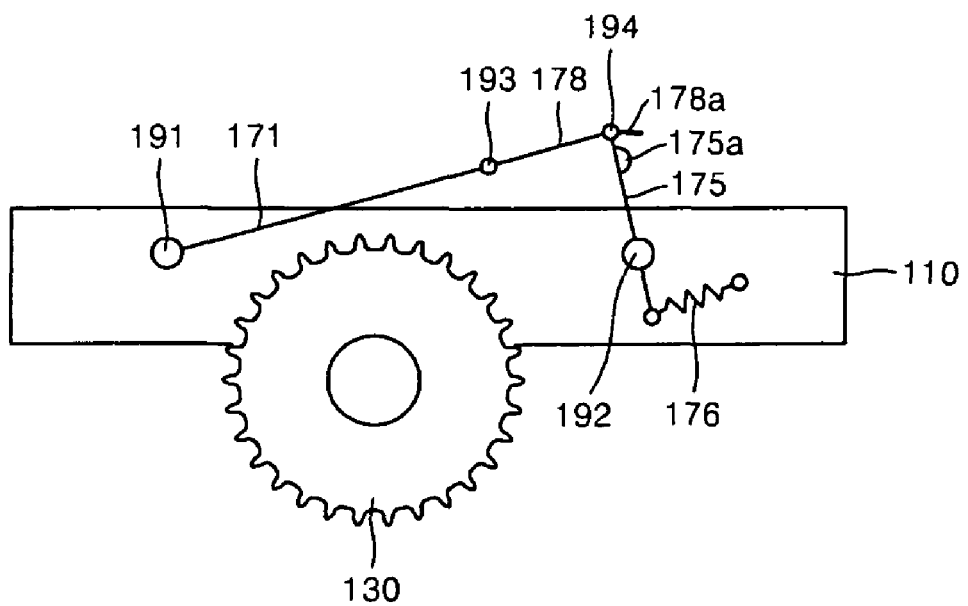
FIG. 8 is a schematic view illustrating the tape feeder of FIG. 3 when the tape feeder switches between closed and open positions according to an embodiment of the present invention.
Figure 9:
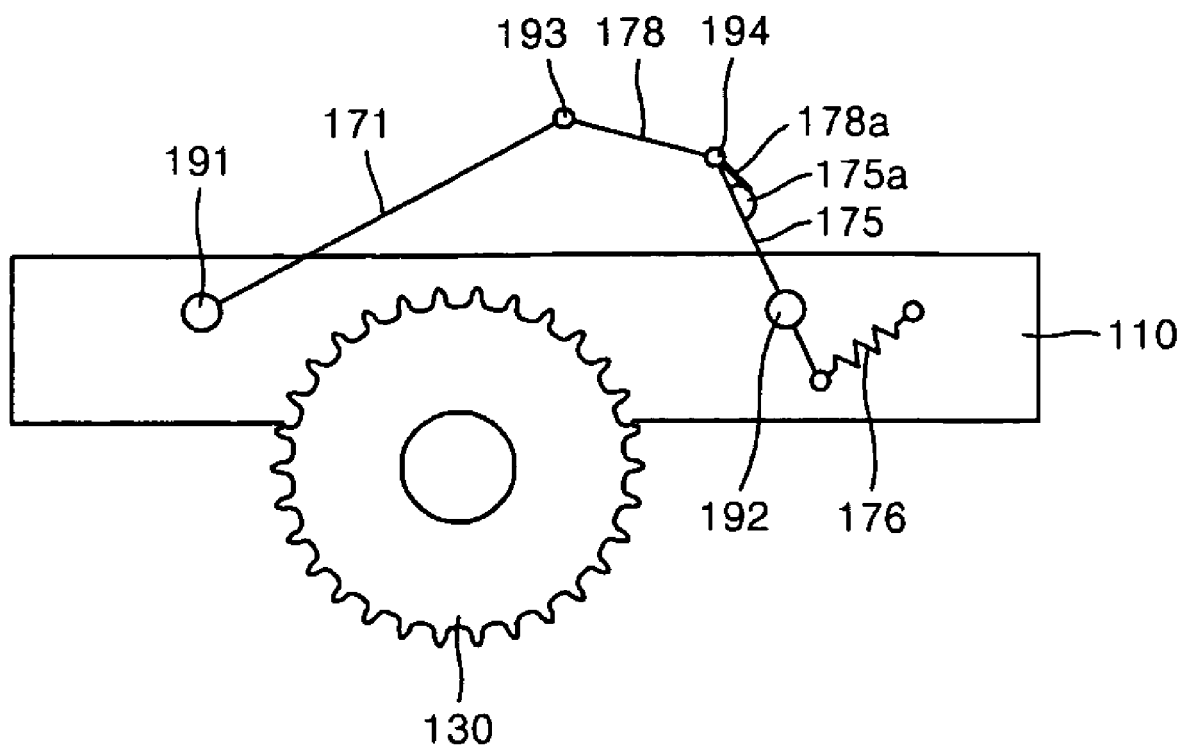
FIG. 9 is a schematic view illustrating the tape feeder of FIG. 3 when the tape feeder is in an open position according to an embodiment of the present invention.

FIG. 7 is a schematic view illustrating the tape feeder 100 when the tape feeder 100 is in a closed position, FIG. 9 is a schematic view illustrating the tape feeder 100 when the tape feeder 100 is in an open position, and FIG. 8 is a schematic view illustrating the tape feeder 100 when the tape feeder 100 is in an intermediate position between the closed and open positions of FIGS. 7 and 9 respectively.

In FIGS. 7 through 9, elements such as the guide unit 172 of the guide shutter 170 are omitted, and other elements are schematically illustrated using lines connected between the first through fourth hinge pins 191, 192, 193, and 194 to provide clearer understanding of the operation of the first link 171, the second link 175, and the middle link 178.

Referring to FIG. 7, the first link 171 of the guide shutter 170 is placed in a closed position. As explained previously, when the first link 171 is in the closed position, the guide unit 172 of the first link 171 can stably guide the tape 80 along the frame 110.

When the first link 171 of the guide shutter 170 is in the closed position as shown in FIG. 7, electronic components can be fed from the tape feeder 100. That is, the tape 80 is fed from the component reel 122, and the top cover tape 81 is removed from the tape 80 to expose electronic components attached to the accommodation tape 82 of the tape 80 so that the electronic components can be picked up.

When the first link 171 is in the closed position, the rearward end of the second link 175 is elastically supported by the spring 176, which is connected between the second link 175 and the frame 110. A tension of the spring 176 is transmitted to the middle link 178 and the first link 171 through the second link 175 such that the first link 171 is positively maintained in the closed position. Because of the bias of spring 176 and the configuration of the links 171, 175, 178 and hinge pins 191, 192, 193, and 194, the guide shutter 170 may not be opened by an accidental force. Therefore, the tape feeder 100 can be used more reliably.

When it is required to replace the component reel 122 with a new one, an operator can switch the guide shutter 170 from the closed position shown in FIG. 7 to an open position shown in FIG. 9 via an intermediate position shown in FIG. 8.

When the operator lifts the first link 171, the rearward end of first link 171 is rotated or pivoted upward about the first hinge pin 191. In this case, the movement of the third hinge pin 193, which connects the first link 171 and the middle link 178, is restricted within a circular arc centered on the first hinge pin 191. Furthermore, the rotation of the second link 175 on the second hinge pin 192 is restricted since the second link 175 is connected to the frame 110 by the spring 176. In addition, the movement of the fourth hinge pin 194, which connects the second link 175 and the middle link 178, is restricted within a circular arc centered on the second hinge pin 192.

Therefore, when the operator lifts the first link 171, the first link 171, the second link 175, and the middle link 178 are moved to the orientations as shown in FIG. 8 owing to the above-described relationship among the first link 171, the second link 175, and the middle link 178. Since the second link 175 is rotated clockwise from the closed position shown in FIG. 7 to the intermediate position shown in FIG. 8, the second link 175 receives a greater tension from the spring 176 in the intermediate position than in the closed position. It is this spring tension that urges the second link 175 to rotate for returning to its orientation when the first link 171 is in the closed position. In other words, the intermediate position shown in FIG. 8 corresponds to a position of the guide shutter 170 in which the guide shutter 170 cannot stably remain. Thus, when the guide shutter 170 is in the intermediate position shown in FIG. 8, unless the operator further lifts the first link 171 upward to place the guide shutter 170 in the open position shown in FIG. 9, the guide shutter 170 will automatically return to the closed position of FIG. 7.

When the guide shutter 170 is moved to the open position shown in FIG. 9 from the intermediate position of FIG. 8, the second link 175 tends to rotate counterclockwise on the second hinge pin 192 because of the bias of the spring 176. However, the second link 175 and the middle link 178 cannot rotate relative to each other about the fourth hinge pin 194 since a stopper 175a of the second link 175 makes contact with a support 178a of the middle link 178. The spring 176 pulls an end of the second link 175 towards the frame 110, and the second link 175 and the middle link 178 cannot rotate relative to each other, such that the first link 171, the second link 175, and the middle link 178 of the guide shutter 170 can be stably placed and positively maintained in the open position as shown in FIG. 9. That is, because of the releasable coupling or engagement between the support 178a and the stopper 175a, the first link 171 can be stably kept in the open position as shown in FIG. 9.

As mentioned previously, when the first link 171 is in the open position, it is not necessary for an operator to hold the first link 171 to keep the first link 171 in the open position. Therefore, the component reel 122 can be replaced with a new one more easily.

After the component reel 122 is replaced with a new one, the first link 171 can be returned to the closed position by pressing the guide unit 172 of the first link 171 toward the frame 110. In detail, when the first link 171 being in the open position as shown in FIG. 9 is depressed, the support 178a and the stopper 175a are uncoupled/disengaged from each other such that they move away from each other. Accordingly the first link 171 is rotated clockwise on the first hinge pin 191. As a result, the second link 175 connected to the first link 171 by the middle link 178 is also rotated clockwise by a predetermined angle against a tension acting on the second link 175 by the spring 176. Therefore, the first link 171, the second link 175, and the middle link 178 can be moved to the intermediate position shown in FIG. 8.

If the first link 171 is further depressed or left untouched while in the intermediate position, the second link 175 is rotated in a reverse direction (counterclockwise direction) although the first link 171 is further rotated in the same direction (clockwise direction). Therefore the first link 171 returns to the closed position as shown in FIG. 7.

Figure 1:
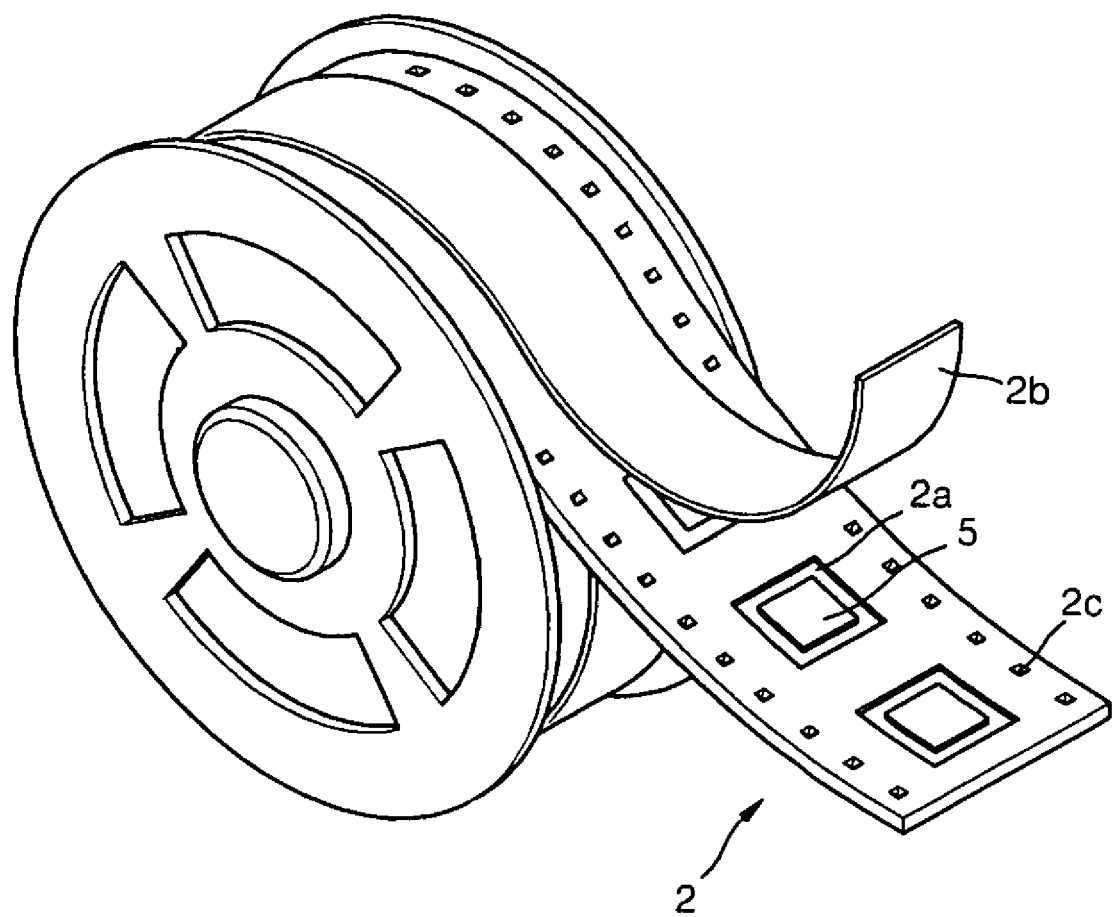
FIG. 1 is a perspective view illustrating a conventional component reel for a tape feeder.
Figure 2:
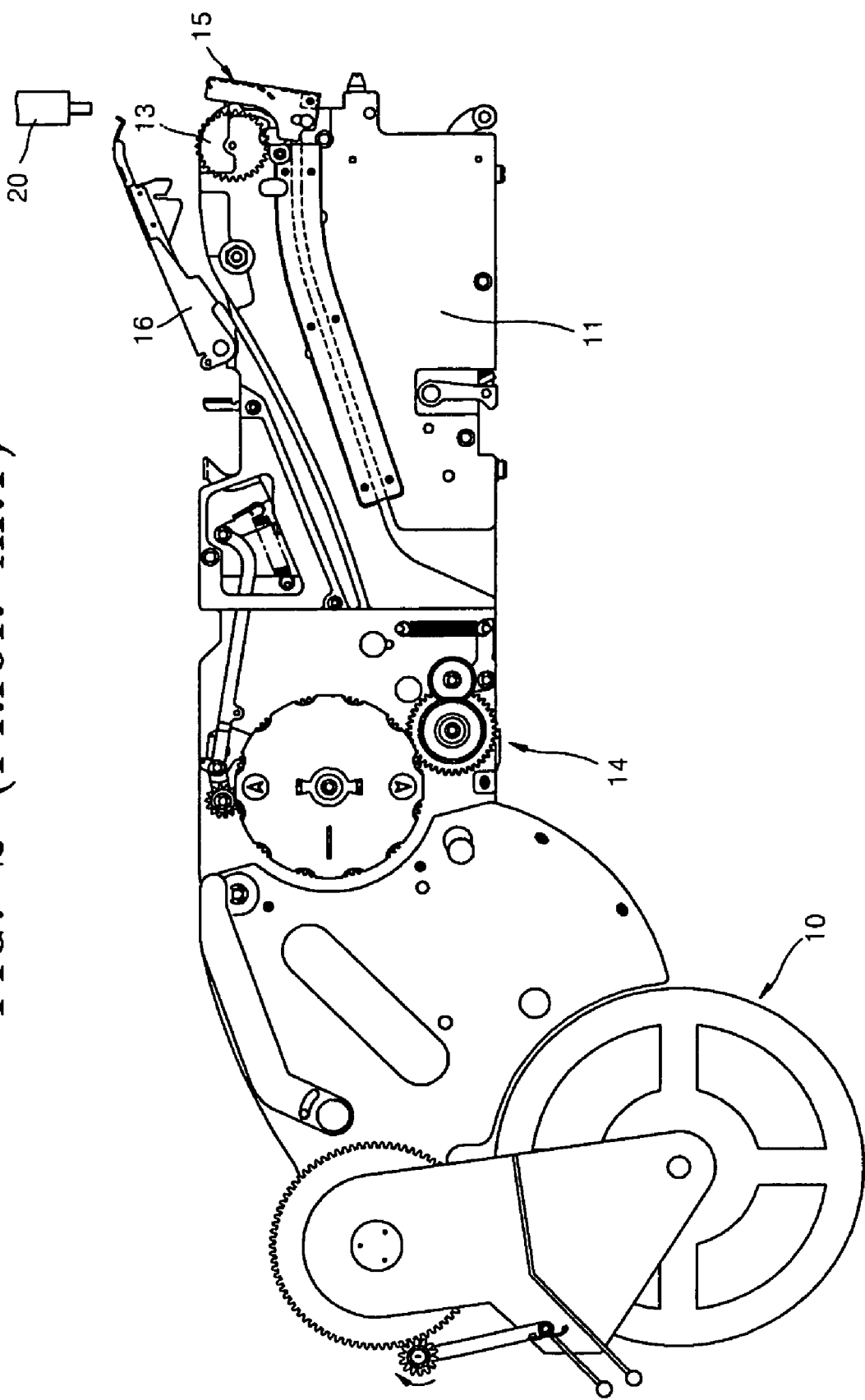
FIG. 2 is a side view illustrating a conventional tape feeder for a chip mounter.

In a conventional tape feeder such as the tape feeder illustrated in FIG. 2, an operator has to unlock the tape guide 16 by handling the lock mechanism 15 and lift the tape guide 16 so as to replace the component reel 10 with a new one. Therefore, it is inconvenient for the operator to replace the component reel 10 since the operator has to use his/her both hands. Furthermore, since the position of the tape guide 16 is not fixed when the tape guide 16 is lifted to the open position, it is more inconvenient to replace the component reel 10.

However, according to the present invention, the tape feeder 100 includes the guide shutter 170 having a one-touch type three-linkage structure. Therefore, an operator can easily switch the guide shutter 170 between closed and open positions only using a hand. Furthermore, since the guide shutter 170 can be stably kept in the open position owing to the spring 176, the support 178a, and the stopper 175a, the component reel 122 can be replaced with a new one more easily. In addition, since the second link 175 is elastically connected to the frame 110, the guide shutter 170 can be stably kept in the closed position.

As described above, according to the present invention, the tape feeder can be easily handled and operated since the tape feeder includes the guide shutter having a one-touch type three-linkage structure.

Furthermore, the guide shutter of the tape feeder can be switched between closed and open positions in a one-touch manner. In addition, the guide shutter can be stably kept in the open position owing to the spring, the support, and the stopper so that the component reel can be easily replaced with a new one.

Moreover, since the second link is elastically connected to the frame, the guide shutter can be stably kept in the closed position. Therefore, electronic components can be stably supplied from the tape feeder, and thus the tape feeder can be used more reliably.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A tape feeder for a chip mounter, comprising:
    a frame having a pick up station along which a tape is fed;
    a first link including a guide unit that guides the tape, and a first end rotatably connected to the frame at one side of the pick up station for movement between a closed position in which the guide unit pushes the tape against the pick up station of the frame and an open position in which the guide unit is distal from the frame;
    a second link rotatably connected to the frame and including a first end elastically coupled to the frame; and
    a middle link including a first end rotatably connected to a second end of the first link, and a second end rotatably connected to a second end of the second link.

2. The tape feeder of claim 1, wherein the middle link further includes an extension projecting from the second end of the middle link, and the second link further includes a stopper engaging the extension of the middle link for positively maintaining the first link in the open position.

3. The tape feeder of claim 1 further comprising a spring connected between the first end of the second link and a portion of the frame.

4. The tape feeder of claim 1, wherein the guide unit comprises an opening through which a portion of the tape is exposed.

5. The tape feeder of claim 1, wherein the guide unit comprises a cutout through which a top cover tape is guided for removing the top cover tape from one side of the tape.

* * * * *